United States Patent [19]

Colman

[11] 4,260,910

[45] Apr. 7, 1981

[54] INTEGRATED CIRCUITS WITH BUILT-IN POWER SUPPLY PROTECTION

[75] Inventor: Derek Colman, Bromham, England

[73] Assignee: Texas Instruments Incorporated, Dallas, Tex.

[21] Appl. No.: 541,462

[22] Filed: Jan. 16, 1975

[30] Foreign Application Priority Data

Jan. 25, 1974 [GB] United Kingdom ............... 3480/74
Mar. 20, 1974 [GB] United Kingdom ............. 12299/74

[51] Int. Cl.³ ........................................... H01L 27/04
[52] U.S. Cl. ............................... 307/303; 307/296 R; 357/22; 357/43; 357/48; 357/51
[58] Field of Search ............... 323/1, 4, 9; 317/16; 357/22, 43, 51, 48; 307/202, 303, 296 R

[56] References Cited

U.S. PATENT DOCUMENTS

| | | | |
|---|---|---|---|
| 3,463,935 | 8/1969 | Rovell | 307/202 |
| 3,541,357 | 11/1970 | Kram | 357/48 |
| 3,603,813 | 9/1971 | Hall | 307/202 |
| 3,631,309 | 12/1971 | Myers | 307/303 |
| 3,829,709 | 8/1974 | Maigret et al. | 307/202 R |

OTHER PUBLICATIONS

Samson, "Obtaining High Resistance in Integrated Circuits", IBM Technical Disclosure Bulletin, vol. 13, No. 8, Jan. 1971, p. 2151.
IEEE Standard Dictionary of Electrical and Electronics Terms, (Wiley-terscience, NY, pub., 1972), p. 132, definition of "current-limiting resistor".

*Primary Examiner*—William D. Larkins
*Attorney, Agent, or Firm*—Melvin Sharp; Gary C. Honeycutt; N. Rhys Merrett

[57] ABSTRACT

To provide an integrated circuit with protection against overvoltage and overcurrent conditions, the channel of a field effect transistor is connected between the d.c. supply conductor for the integrated circuit and a further conductor for connection to one pole of a d.c. source for the circuit. The channel of the transistor is provided by a region of an epitaxial layer on a substrate of opposite conductivity type which provides a back gate for the transistor. A conductor is provided for connecting the substrate to the other pole of the d.c. source. The d.c. supply line voltage for the integrated circuit is thereby limited to the pinch-off voltage of the field effect transistor and the power supply current is limited to the zero gate-bias drain current of the field effect transistor. A protection arrangement also is disclosed for limiting forward current flow through an isolation diode in an integrated circuit resulting from accidental reverse polarity connection of a d.c. source to the circuit. The isolation diode is connected to the d.c. supply conductor only through a path including a current limiting resistor. A circuit combining both protection features also is described, the protection resistor connecting one end of the field effect transistor channel to the conductor for connection to the d.c. supply source to limit forward current flow through the diode junction between the transistor channel region and the substrate back gate region resulting from accidental reverse polarity connection of a d.c. source for the circuit.

18 Claims, 8 Drawing Figures

INTEGRATED CIRCUITS WITH BUILT-IN POWER SUPPLY PROTECTION

This invention relates to integrated circuits including means for protecting them from damage due to improper application of supply currents or voltages, and relates particularly to integrated circuits in which the protection means is incorporated in the integrated circuit and fabricated along with it.

In integrated circuit technology the bar area, that is the surface area of the epitaxial layer on the substrate, occupied by any component should ideally be as small as possible to permit the substrate and epitaxial layer materials to be used economically, and the number of impurity doping steps particularly those requiring selective removal of a protective (usually oxide) layer overlying the epitaxial layer surface should also be kept to a minimum. The number of impurity doping steps required to produce any integrated circuit has a considerable influence on the cost of that circuit, whereas the complexity of the patterns used at each impurity doping step does not greatly affect the cost of producing that circuit, assuming that the area of the circuit is not changed.

In certain applications of integrated circuits, there can be danger of application of excessive voltages and currents to the circuit, as well as danger of connection of a d.c. supply to the circuit with reverse polarity. An example of such in an environment occurs in motor vehicle applications of integrated circuits, e.g. in alternator regulators operating a low voltages. In such an application, the integrated circuit is liable to be subjected to high voltage spikes on the supply lines, and there is danger of accidental reverse connection of the storage battery providing the d.c. supply source for the integrated circuit.

Previously suggested circuits for protecting integrated circuits from damage due to the application of excessive currents or voltages have generally been fairly complex, with the result that they have required substantial bar area and have often required additional impurity doping steps in fabrication.

It is an object of the present invention to provide a relatively simple, yet practically effective, protection for integrated circuits.

According to one aspect of the invention, there is provided an integrated circuit having a semiconductor substrate of first conductivity type and an epitaxial layer thereon in which there is formed a plurality of electronic circuit elements, the epitaxial layer being of second conductivity type opposite to that of the substrate, in which there is formed in the epitaxial layer a depletion mode field effect transistor having the substrate as a gate electrode and the epitaxial layer as a channel, a first d.c. supply conductor for the circuit being connected through the channel of the field effect transistor to supply the electronic circuit elements and a second supply terminal for the circuit being connected to the substrate.

The field effect transistor may have a second gate electrode formed by a region of the first conductivity type at the surface of the epitaxial layer remote from the substrate. The second gate electrode may be connected to the substrate. The field effect transistor may be isolated from the other components in the epitaxial layer by means of a region of the first conductivity type which penetrates the epitaxial layer. The circuit may be formed on a substrate of p-type or n-type conductivity.

The field effect transistor, which may be a junction field effect transistor, provides both overvoltage and overcurrent protection when the supply voltage exceeds a predetermined value, but does not substantially reduce the voltage applied to the integrated circuit while the voltage is within the range suitable for the integrated circuit.

According to a further aspect of the present invention, there is provided an integrated circuit including a resistor element formed by a first region of semiconductor material of a first conductivity type in a second region of semiconductor material of a second conductivity type on a substrate of semiconductor material of the first conductivity type, a first supply conductor for a voltage supply of one polarity connected to a terminal of the resistor element, and a second supply conductor for a voltage supply of opposite polarity to that of the first conductor connected to the substrate, in which to prevent parasitic transistor action between the first and second regions and the substrate the second region is connected to the first supply conductor, wherein there is provided a further resistor element formed by a third region of semiconductor material of the first conductivity type in the second region, and the second region is connected to the first supply conductor only through the further resistor element.

The resistor element may be, for example, the collector load of a transistor included in the integrated circuit. The first and third regions may be formed as a single elongated region if the resistor element formed by the first region has a terminal directly connected to the first supply conductor.

Yet a further aspect of the invention combines the above-described overvoltage, overcurrent and reverse-polarity d.c. supply protection circuits by utilization of a resistor in a sole connection path between the first d.c. supply conductor and one end of the channel of the depletion mode field effect transistor of the overvoltage and overcurrent protection circuit.

The construction and operation of integrated circuits in accordance with examples of the invention will now be described with reference to the drawings in which.

Figure 1:
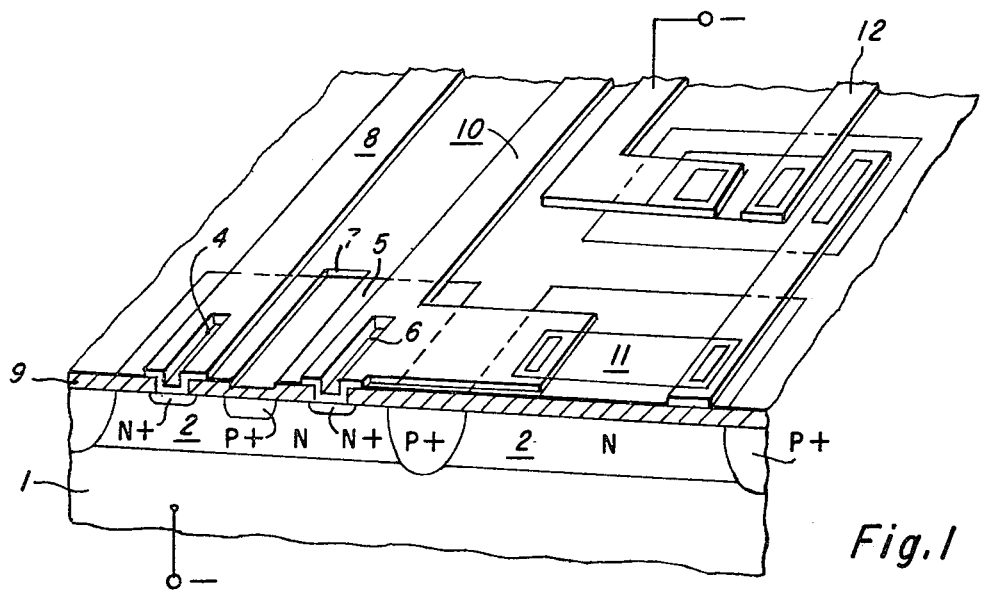
FIG. 1 represents a part of an integrated circuit including an overvoltage and overcurrent protection layout of field effect transistor in accordance with an embodiment of the invention.

Referring to FIG. 1 in which 1 represents a P-type semiconductor, e.g. silicon, substrate having an N-type epitaxial layer 2 formed thereon. P+-type regions 3 extending through the layer 2 to the substrate 1 isolate the different parts of the epitaxial layer 2 from one another. The left hand part shown of the epitaxial layer 2 has first and second N+-type regions 4 and 6 therein, but not extending to the substrate 1. In addition, a P+-type region 5 lies between the regions 4 and 6, the region 5 similarly not extending to the substrate 1. The N+-type regions 4 and 6 form the source and drain of a junction field effect transistor, the channel of which is formed by the epitaxial layer 2 between the regions 4 and 6, and the substrate 1 and the P+-type region 5 act as first and second gates for controlling the resistance of the channel by means of the associated depletion zones in known manner.

The region 5 overlaps part of the isolation region 3 at 7 so that the region 5 is connected to the substrate 1 through the region 3. A positive supply voltage conductor 8 is formed on an insulating layer 9 on the surface of the epitaxial layer 2 and is connected to the region 4 through a suitable aperture in the layer 9. Another conductor 10 is formed on the layer 9 and is connected to the region 6 through a suitable aperture in the layer 9. The conductor 10 is also connected to a resistor 11, which in turn is connected to the collector of a bipolar transistor 12. The resistor 11 is formed by a P+-type conductivity region in a part of the epitaxial layer 2 isolated from the field effect transistor and the transistor 12 by the region 3. The transistor 12 is formed as a planar device in another isolated region of the layer 2.

The field effect transistor is constructed as part of the integrated circuit represented by the resistor 11 and the transistor 12 using the substrate 1 as one gate, conventional base region as the other gate 5 and part of the epitaxial layer as the channel 2. The source and drain contacts 4, 6 may be made using conventional emitter diffusion or deep N+ collector diffusion. Thus no additional processing is required to produce the field effect transistor. For a typical epitaxial layer a resistivity of 3 to 5 ohm-cm; is obtained for a thickness of 11 to 13 $\mu$m. The pinch-off voltage of such an FET will be in the range 10 to 30 volts and its breakdown voltage will be around 200 volts. The FET would be designed to cause a low voltage drop at the circuit operating current. For 4 mA the device would occupy an area of the substrate approximately 625 $\mu$m by 625 $\mu$m.

Figure 2:
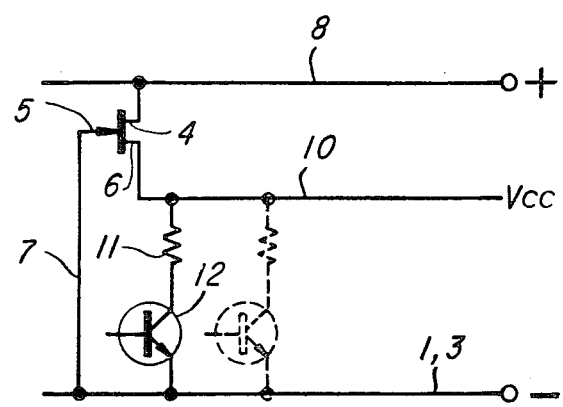
FIG. 2 shows the connection of the field effect transistor in relation to the integrated circuit and a d.c. electrical supply.

The FET is shown as separate from the remainder of the integrated circuit represented by resistor 11 and transistor 12 in FIG. 2, and connected as shown the integrated circuit supply voltage $V_{cc}$ on the conductor 10 cannot be greater than the FET pinch-off voltage, provided that the voltage on the positive supply line 8 relative to the substrate 1 to which the negative supply line is connected does not exceed the breakdown voltage of the FET. Furthermore, the FET will limit the current to its zero gate bias drain current in the event of a short circuit condition in the integrated circuit. It will be appreciated that all or some of the various doped regions formed in the epitaxial layer may be formed by ion implantation techniques rather than diffusion techniques as described above.

Integrated circuits are being applied in motor vehicles in such areas as alternator regulators operating at low voltages, but in such applications they must withstand high voltage spikes on the supply line without damage. This embodiment of the invention provides an integrated circuit which is protected against voltage transients and also prevented from drawing excessive current which could damage it.

It will be appreciated that the circuit described above can also be constructed on an N-type substrate with a P-type epitaxial layer, in which case the field effect transistor would be a P-channel device. Moreover, the integrated circuit is not limited to the configuration shown which is merely a simple example, but may contain many alternative or additional circuits.

Figure 3:
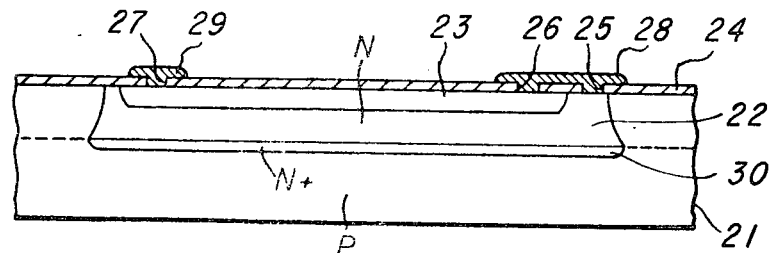
FIG. 3 is a cross-section, not to scale, of a prior art integrated circuit resistor and electrical connections thereto.

FIG. 3 is a cross-section of a resistor formed as part of an integrated circuit in accordance with a prior art technique. The integrated circuit itself is formed on a substrate 21 of semiconductor material of P-type conductivity on which is deposited an epitaxial layer of N-type conductivity material. Isolation regions of P-type conductivity are formed in the epitaxial layer so as to form isolated regions of N-type conductivity separated from one another by the P-type regions. In one isolated region 22, a resistor region 23 lying entirely within the region 22 is converted to P-type conductivity by, for example, diffusion or ion beam implantation. The region 23 is usually formed as a thin strip or a convoluted thin strip and the impurity level in it is controlled so as to produce a desired resistance between the ends of the region. After the region 23 has been formed, holes 25, 26 and 27 are formed through an insulating film on the surface of the substrate. The insulating film 24 may be the mask through which the regions below are doped. The holes 26 and 27 are over the region 23 near its ends and provide points of connection for terminals of the resistor formed by the region 23. The hole 25 is over the surface of the region 22. If no connection were made to the region 22 in which the resistor 23 is formed, there would be a likelihood of parasitic transistor action taking place between the regions 22 and 23 and the substrate 21 which, as can be seen, forms a P-N-P transistor structure. Although the gain of such a transistor would be small, the leakage resulting from the transistor action could be significant and interfere with the proper operation of the integrated circuit.

It is therefore customary to connect the region 22 to the most positive supply conductor on the integrated circuit so as strongly to reverse bias the P-N junctions between the region 23 and the region 22, and between the region 22 and the substrate 21 to prevent the transistor action occuring. Frequently in integrated circuits a resistor is connected to the positive supply conductor, as a collector load for example, and this connection, which is in effect between the holes 25 and 26, is represented by the metallization 28 shown in FIG. 3. Another portion 29 of metallization provides the terminal at the other end of the resistor formed by the region 23. A buried region 30 of N+ conductivity is commonly formed below the region 22 in which the resistor is formed for the purpose of minimizing the transistor action.

Figure 4:
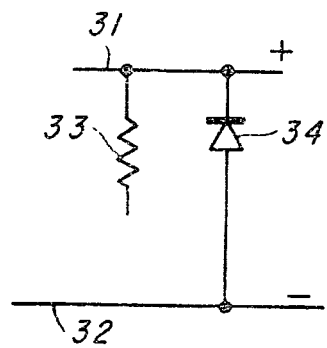
FIG. 4 is the equivalent circuit diagram of the resistor shown in FIG. 3.

FIG. 4 showns in diagrammatic form the equivalent circuit produced by the arrangement shown in FIG. 3 in which the positive supply conductor 31 corresponds to metallization 28 of FIG. 3, the negative supply conductor 32 is the substrate 21 and resistor 33 is formed by the region 23. The diode 34 of FIG. 4 is formed by the P-N junction between the region 22 and the substrate 21, and in the correct operation of the circuit with a positive supply applied to the conductor 31, the diode 34 is reverse-biassed and consequently does not conduct. However, should the supply be connected with the wrong polarity, that is to say, with its negative terminal connected to the conductor 31 and its positive terminal to the conductor 32, a very large current will flow through the diode 34 which would be forward biassed under these circumstances. This large current, which in FIG. 3 is through the P-N junction between the region 22 and the substrate 21 can cause a large amount of heat to be generated which could well destroy or seriously damage the integrated circuit.

Figure 5:
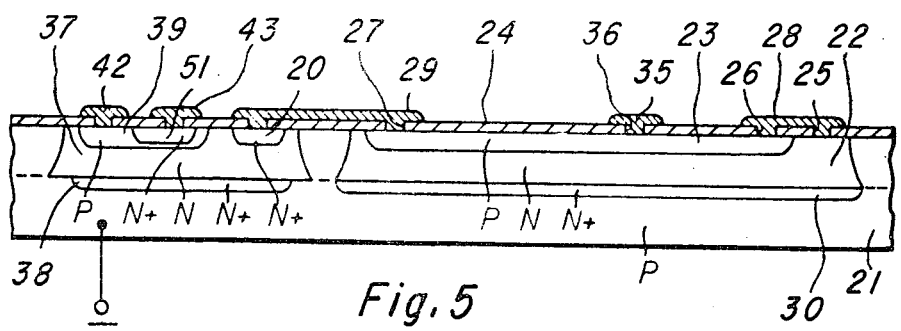
FIG. 5 is a cross-section of part of an integrated circuit formed according to another embodiment of the present invention.

FIG. 5 shows a second embodiment of the invention and parts which correspond to those of FIG. 3 carry the same reference numerals as in that figure. In FIG. 5 the circuit shown includes an integrated resistor formed by a P-type region 23 formed in a region 22 of an epitaxial layer of N-type conductivity deposited on the substrate 21 of P-type conductivity. As in FIG. 3, various regions of the epitaxial layer are separated from one another by P-type isolation areas. The resistor formed by the region 23 in FIG. 5 is of greater resistance from end to end than the region 23 of FIG. 3, and includes an intermediate connection 35 through an additional hole 36 in the insulating film 24. For the purpose of comparison only it will be assumed that the resistance between the connection 35 and the metallization 29 in FIG. 5 is the same as the resistance between the metallizations 28 and 29 of FIG. 3. However, as shown in FIG. 5, the region 23 extends in opposite directions from the connection 35 so that the metallization 28 is separated by the resistance offered by the right-hand portion of the region 23 from the connection 35. There is also shown in FIG. 5 an N-P-N transistor formed in another region 37 of the epitaxial layer. Beneath the region 37 there is a buried layer 38 of N+-type conductivity, and in the region 37 itself there are formed a P-type base region 39 and an N+ conductivity type region 40 for improving the contact of a collector connection to the region 37. An N+ conductivity type region 41 is formed in the base region 39 as an emitter for the transistor. Contact metallizations 42 and 43 are provided through respective holes in the insulating film 24 as connections to the base and emitter electrodes of the transistor. The metallization 29 is extended and forms the connection to the collector of the transistor by contacting the region 40.

In the operation of the arrangement of FIG. 5, the positive supply is not applied to the metallization 28 but to the connection 35, the negative supply being applied to the substrate 21.

Figure 6:
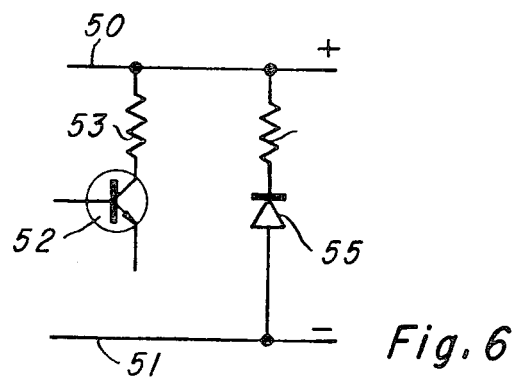
FIG. 6 is the equivalent diagram of FIG. 5.

The circuit shown in FIG. 6 is that produced by the configuration described above with reference to FIG. 5, and includes a positive supply conductor 50, a negative supply conductor 51, and an N-P-N transistor 52 having a collector load resistor 53 connected between its collector and the conductor 50. From the conductor 50 to conductor 51 is connected a resistor 54 and a diode 55 is series.

Comparing FIG. 6 with FIG. 5, and FIG. 5 with FIG. 3, it will be apparent that the diode 55 is formed by the P-N junction between the region 22 and the substrate 21 of FIG. 5 and the resistor 54 by the right-hand part of the region 23 between the connection 35 and the metallization 28. The left-hand portion of the region 23, that is to say, between the connections 35 and metallization 29, forms the resistor 53 of FIG. 6 and the regions 37 to 41 together form the N-P-N transistor 52.

During the normal operation of the arrangement described with reference to FIGS. 5 and 6, the transistor and its collector load operate in the normal manner, parasitic transistor action being prevented by the connection of the region 22 through the resistor formed by the right-hand part of the region 23 to the connection 35. As no current flow through the right-hand part of the region 23 in the normal operation of the circuit because the P-N junction between the region 22 and the substrate 21 is reversed biassed, it follows that the region 22 is maintained at the maximum positive potential of the circuit and therefore the inhibition of the parasitic transistor action occurs in the same way as has been described with reference to FIGS. 3 and 4.

Should, however, the power supply be connected to the integrated circuit with reversed polarity so that the negative supply terminal is connected to the connection 35 and the positive to the substrate 21, the diode formed by the P-N junction between the region 22 and the substrate 21 will conduct as described above but the current through it will be limited by the resistance offered by the right-hand portion of the region 23 and this can be made sufficiently large for the heating of the integrated circuit to be kept low enough to avoid damage. There will be a small leakage current across the P-N junction formed by the region 22 and the substrate 21 during the normal operation of the circuit in which this junction is reversed biassed as a result of thermal excitation of carriers, and the resistance of the right-hand part of the region 23 should be chosen with this in mind to ensure effective suppression of the parasitic transistor action; but this would not be a limiting design factor as the resistor would be made as small as possible, consistent with low heating, so as to use a minimum amount of surface area.

It will be appreciated that many modifications can be made to the basic circuit shown in FIGS. 5 and 6 without departing from the invention. For example, the left-hand and right-hand parts of the region 23 need not be contiguous, and many other resistor regions could be formed in the region 22. If several such integrated resistors are formed, it is of course not necessary for more than one to be provided for connecting the region 22 to the most positive supply voltage. It is, moreover, not necessary for any of the resistors to be connected to the most positive supply connection of the circuit, although it should be borne in mind that an N-P-N transistor such as that shown in FIG. 5 would not be protected by such an arrangement according to the invention if its collector electrodes were connected directly to the most positive supply conductor. In the arrangement shown in FIGS. 5 and 6, however, the resistor formed by the left-hand part of the region 23 provides the necessary current limitation for protecting the transistor shown. If the circuit should include a P-N-P lateral transistor, the emitter of this may be connected directly to the positive supply conductor without risk, because the base emitter junction will provide the necessary protection.

Figure 7:
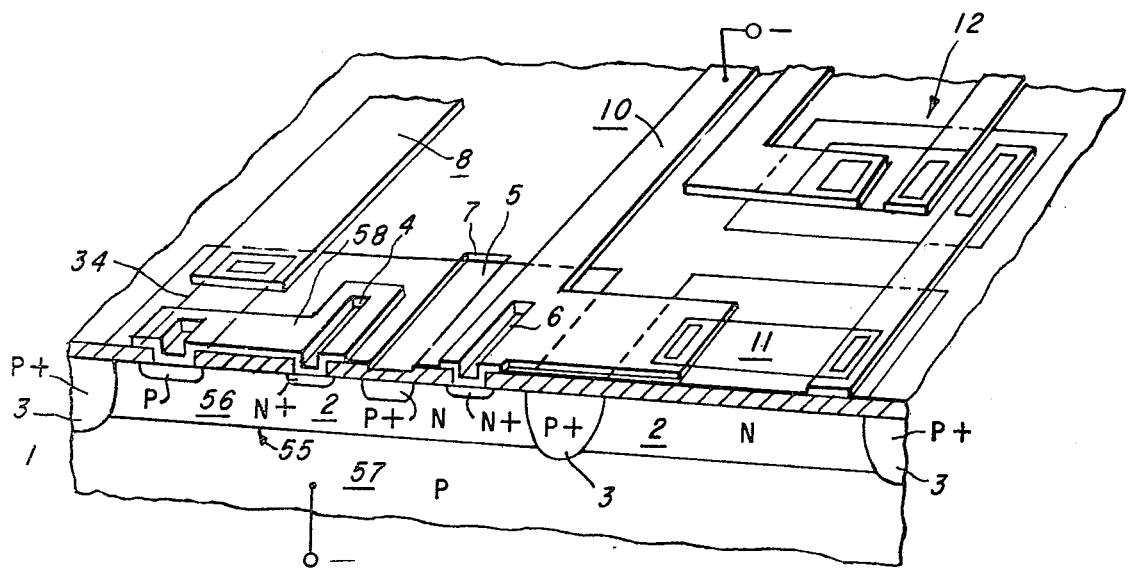
FIG. 7 is a cross-section of part of an integrated circuit including protection circuits as shown in FIGS. 1 and 5.
Figure 8:
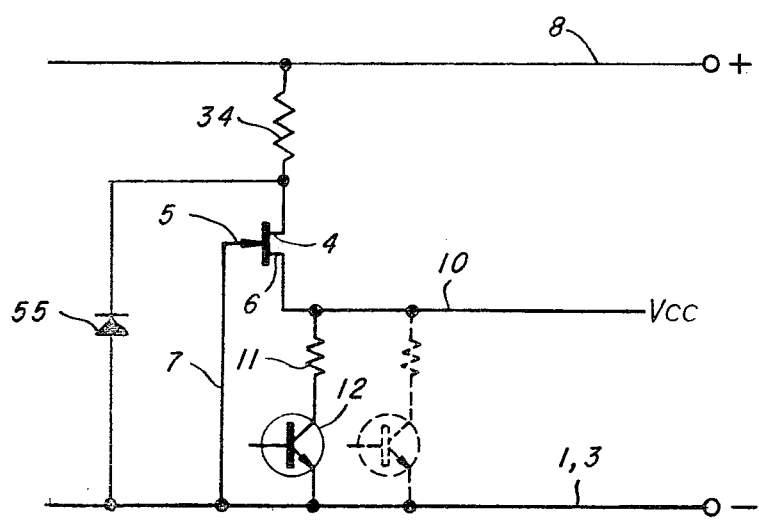
FIG. 8 is the equivalent circuit diagram of FIG. 7.

The overvoltage, overcurrent protection circuit described with reference to FIGS. 1 and 2 may advantageously be combined with the d. c. supply reverse polarity protection circuit described with reference to FIGS. 5 and 6. Such an arrangement is shown in FIGS. 7 and 8. In FIGS. 7 and 8 the current limiting resistor 34 is connected between the positive supply line 8 and one end of the channel of the JFET by a conductor 58, since the isolation diode 55 to be protected appears between the end-channel 56 of JFET and the gate region defined by the underlying substrate region 57. In FIG. 7, the resistor 34 is shown defined in the epitaxial island 2 containing the JFET, and the equivalent circuit is shown in FIG. 8. Upon accidental polarity reversal of the d.c. supply source across supply conductors 8 and 3, the JFET is pinched off and forward current to the isolation diode 55 is limited by the resistor 34. In design of an integrated circuit incorporating a protection arrangement as shown in FIGS. 7 and 8, account would need to be taken of the voltage drop across the resistor 34, in normal operation of the circuit, resulting in a reduced value of $V_{cc}$ for a given supply source voltage across conductors 8 and 3.

Clearly, an integrated circuit in accordance with FIGS. 5, 6 and 7, 8 may be fabricated using an N-type substrate and a P-type epitaxial layer and incorporating a P-channel JFET to provide the overvoltage and overcurrent protection function.

What is claimed is:

1. An integrated circuit comprising a semiconductor substrate of one conductivity type, an epitaxial layer of opposite conductivity type on a surface of said substrate, said integrated circuit including circuit elements in said epitaxial layer, a first d.c. supply conductor for said circuit elements, a second d.c. power conductor for connection to one pole of a d.c. power source, said first and second conductors disposed over and insulated from said epitaxial layer, a third d.c. power conductor for connecting the substrate to the other pole of said d.c. power source, means functionally connecting said circuit elements between said first and third conductors, and voltage/current overload protection circuit means for said integrated circuit comprising depletion mode field effect transistor means separate from said functionally connected circuit elements and having a channel defined by a region of said epitaxial layer, a region of said substrate underlying said epitaxial region defining a gate region for said field effect transistor, said gate region connected to said third conductor, the channel of said field effect transistor serially connecting said first d.c. supply conductor to said second d.c. power conductor for limiting the maximum voltage that can be supplied by said power source across the second and third conductors to a value defined by the pinch-off voltage of said field effect transistor means and for limiting the maximum current flow between the second and third conductors to a value defined by the zero gate bias drain current of said field effect transistor means.

2. An integrated circuit according to claim 1, wherein said field effect transistor includes a second gate region of said one conductivity type formed at the surface of said epitaxial layer region remote from said substrate, said second gate region electrically communicating with said substrate.

3. An integrated circuit according to claim 1, including a region of said one conductivity type extending through said epitaxial layer to define said region of the epitaxial layer.

4. An integrated circuit according to claim 1, wherein the substrate has P-type conductivity and the epitaxial layer has N-type conductivity, and wherein the second and third conductors are for connection to the positive and negative poles respectively of said d.c. source.

5. An integrated circuit according to claim 1, wherein the substrate has N-type conductivity and the epitaxial layer has P-type conductivity, and wherein the second and third d.c. supply conductors are for connection to the negative and positive poles respectively of said d.c.source.

6. An integrated circuit comprising a semiconductor substrate of one conductivity type, an epitaxial layer of opposite conductivity type on a surface of said substrate, said integrated circuit including circuit elements formed in islands of said epitaxial layer, a first d.c. supply conductor and a second d.c. power conductor on an insulating layer overlying said epitaxial layer and a third d.c. power conductor connected to said substrate, means connecting said circuit elements in a functional circuit between said first and third conductors, said second and third conductors for connection to respective poles of a d.c. power source for said integrated circuit, and voltage/current overload protection means for said integrated circuit including a depletion mode field effect transistor separate from said functional circuit and having a channel region defined in a further island of said epitaxial layer bounded by a region of said one conductivity type extending through the epitaxial layer, said field effect transistor having a first gate region comprising a region of said substrate underlying the said channel region and a second gate region comprising a region of said one conductivity type in the surface of said channel region adjacent said insulating layer and electrically connected through the epitaxial layer to said first gate region; said third conductor connected to said second gate region; said channel region having opposite ends connected respectively to said first and second conductors for limiting the maximum voltage between the first and third conductors to a value defined by the pinch-off voltage of said field effect transistor and for limiting the maximum d.c. current between said first and second conductors to a value defined by the zero gate-bias current of said field effect transistor.

7. An integrated circuit according to claim 6, wherein said second gate region extends laterally beyond the boundary of said further island and is electrically connected to said substrate by said bounding region of one conductivity type extending through the epitaxial layer.

8. An integrated circuit comprising a P-type semiconductor substrate having an N-type epitaxial layer on a surface thereof; said integrated circuit including circuit elements formed in islands of said epitaxial layer defined by regions of said P-type conductivity extending through said epitaxial layer, one of said islands including an N-P-N transistor, a second one of said islands including a resistor, a first d.c. supply conductor and a second d.c. power conductor on an insulating layer overlying said epitaxial layer and a third d.c. power conductor connected to said substrate; means connecting said resistor and said N-P-N transistor in series between said first and third conductors to form part of a functional circuit; said second and third conductors defining positive and negative power supply conductors for connection to positive and negative poles respectively of a d.c. power source for said integrated circuit; and voltage/current overload protection circuit means for said integrated circuit including an N-channel field effect transistor separate from said functional circuit and having a channel defined in a further one of said islands of said epitaxial layer; said field effect transistor having a first gate region comprising a region of said substrate underlying said channel region and a second gate region comprising an elongated P-type region in the surface of said channel region adjacent to said insulating layer and extending beyond the boundary of said further islands for connection with said substrate region through a P-type region extending through the thickness of said epitaxial layer; N-type contact regions provided in said channel region on opposite sides of said second gate region; conductor means on said insulating layer connecting said contact regions respectively to said first and second conductors to connect the channel of said field effect transistor in series between said first and second conductors for limiting the maximum voltage between the first and third conductors to a value defined by the pinch-off voltage of said field effect transistor; and for limiting the maximum d.c. current between said first and third conductors to a value defined by the zero gate-bias current of said field effect transistor.

9. An integrated circuit comprising a semiconductor substrate of one conductivity type, an epitaxial layer of opposite conductivity type on a surface of said substrate, said integrated circuit including a plurality of circuit elements provided in islands of said epitaxial layer bounded by regions of said one conductivity type extending through the thickness of the epitaxial layer, one of said circuit elements including a resistor defined by a first region of said one conductivity type in one of said epitaxial layer islands, said one island and said substrate defining a diode junction; first and second d.c. supply conductors for connection to a d.c. supply source for said integrated circuit; said first conductor disposed on and insulated from said epitaxial layer and connected to one end of said first region; and d.c. supply souce polarity reversal protection means for said integrated circuit comprising a third region of said one conductivity type formed in said one epitaxial island to define a further resistor; means connecting the further resistor to said first supply conductor and means connecting said one epitaxial island to said further resistor such that said epitaxial island is connected to said first supply conductor only by said further resistor thereby to limit forward current flow through said diode junction upon reverse polarity connection of said first and second conductors to said d.c. supply source.

10. An integrated circuit according to claim 9, wherein said first and third regions are contiguous.

11. An integrated circuit according to claim 9, wherein said first and third regions are defined by a single region of said one conductivity type, conductive means on said insulating layer connecting one end of said contiguous region with said epitaxial island, and wherein said first supply conductor is connected to said single region intermediate to the ends thereof.

12. An integrated circuit according to claim 9, wherein said first resistor is a load resistor for a transistor of the integrated circuit formed in another one of said epitaxial islands.

13. An integrated circuit according to claim 9, wherein said substrate is P-type, said epitaxial layer is N-type, and said resistor regions are P-type.

14. An integrated circuit comprising a semiconductor substrate of one conductivity type, an epitaxial layer of opposite conductivity type on a surface of said substrate, said integrated circuit including circuit elements in said epitaxial layer, a first d.c. supply conductor for said circuit element and a second d.c. power supply conductor for connection to one pole of a d.c. power source, said first and second conductors disposed over and insulated from said epitaxial layer, said substrate being connected to a third power supply conductor for connection to the other pole of said d.c. source, means functionally connecting said circuit elements between said first and third conductors; a combined voltage/current overload and power source reversed polarity protection circuit for said integrated circuit comprising a depletion mode field effect transistor separate from said functionally connected circuit elements, said field effect transistor having a channel defined by a region of said epitaxial layer; a region of said substrate underlying said epitaxial region defining a gate region for said field effect transistor and forming a diode junction with said substrate, and a resistor formed in said epitaxial layer, means connecting the channel of said field effect transistor in series between said first conductor and said second conductor for limiting the maximum voltage that can be applied by said power source across the first and third conductors to a value defined by the pinch-off voltage of said field effect transistor and for limiting the maximum current flow between the first and third conductors to a value defined by the zero gate-bias drain current of said field effect transistor, said resistor providing the sole means connecting the channel of said field effect transistor to said second conductor for limiting forward current flow through said diode junction caused by accidental reversed polarity connection of said second and third power supply conductors to said d.c. power source.

15. An integrated circuit according to claim 14, wherein said resistor is formed by a region of said one conductivity type in said region of the epitaxial layer.

16. An integrated circuit comprising a P-type semiconductor substrate, an N-type epitaxial layer on a surface of said substrate, said integrated circuit including circuit elements formed in islands of epitaxial layer defined by P-type conductivity regions extending through said epitaxial layer, a first d.c. supply conductor and a second d.c. power supply conductor on an insulating layer overlying said epitaxial layer and a third d.c. power supply conductor connected to said substrate, means functionally connecting said circuit elements between said first and third conductors such that said first conductor defines a d.c. supply line for said functionally connected circuit elements, said second and third conductors defining power supply conductors for connection respectively to the positive and negative poles of d.c. power supply source; combined voltage/current overload protection and d.c. power source reversed polarity protection circuit means for said integrated circuit including an N-channel depletion field effect transistor separate from said functionally connected circuit elements, said field effect transistor having a channel region defined in a further island of said epitaxial layer bounded by a P-type conductivity region extending through the epitaxial layer, said field effect transistor having a first gate region comprising a region of said substrate underlying said channel region, said channel region and said substrate region defining a diode junction, and a second gate region comprising a P-type conductivity region in the surface of said channel region adjacent said insulating layer and electrically connected to said substrate through said epitaxial layer; a P-type resistor formed in said further island of said epitaxial layer, means connecting one end of the channel of said field effect transistor to said first conductor, means connecting the other end of the channel of said field effect transistor to said second conductor only through an electrical path including said resistor such that said field effect transistor and said resistor provide a series interconnection of said first and second conductors for limiting the maximum voltage between said first and third conductors to a value defind by the pinch-off voltage of said field effect transistor and for limiting the maximum d.c. current between said first and third conductors to a value defined by the zero gate-bias current of said field effect transistor, said resistor limiting current flow in a forward direction through said diode junction caused by accidental reversed polarity connection of said second and third conductors to said d.c. supply source to prevent thermal damage to said integrated circuit caused by said forward current flow through said diode.

17. In an integrated circuit comprising a plurality of circuit elements formed in a semiconductor substrate and including a first supply conductor for said circuit elements and a second d.c. power supply conductor connected to said substrate, the improvement comprising a depletion mode junction field effect transistor having a channel connected between the first supply conductor and a third d.c. power supply conductor, said second and third power supply conductors for connection to respective poles of a d.c. power source, and said field effect transistor including a gate defined by a region of said substrate connected to said second supply conductor for limiting the maximum voltage between said first and third supply conductors to a value defined by the pinch-off voltage of said field effect transistor and to limit the maximum d.c. current flow between said first and third conductors to a value defined by the zero gate-bias current of said field effect transistor.

18. An integrated circuit according to claim 17, wherein the channel of said field effect transistor is connected to said third conductor by a single conduction path including a resistor for limiting current flow between said third and second supply conductors to protect said integrated circuit against accidental reverse polarity connection of said third and second conductors and said d.c. source.

* * * * *